(12) United States Patent
Sakong et al.

(10) Patent No.: US 8,378,381 B2
(45) Date of Patent: *Feb. 19, 2013

(54) GAN-BASED SEMICONDUCTOR LIGHT EMITTING DEVICE

(75) Inventors: Tan Sakong, Gyunggi-do (KR); Cheol Soo Sone, Gyunggi-do (KR); Ho Sun Paek, Gyunggi-do (KR); Suk Ho Yoon, Seoul (KR); Jeong Wook Lee, Gyunggi-do (KR)

(73) Assignee: Sumitomo Electric Industries, Ltd., Osaka (JP)

( * ) Notice: Subject to any disclaimer, the term of this patent is extended or adjusted under 35 U.S.C. 154(b) by 83 days.

This patent is subject to a terminal disclaimer.

(21) Appl. No.: 12/890,361

(22) Filed: Sep. 24, 2010

(65) Prior Publication Data

US 2011/0012145 A1 Jan. 20, 2011

Related U.S. Application Data

(63) Continuation of application No. 12/251,872, filed on Oct. 15, 2008, now Pat. No. 7,825,428.

(30) Foreign Application Priority Data

Feb. 11, 2008 (KR) ........................ 10-2008-0012244

(51) Int. Cl.
*H01L 33/32* (2010.01)
(52) U.S. Cl. .................... 257/103; 257/E33.034; 438/46
(58) Field of Classification Search .................... 257/76, 257/77, 79, 85, 94, 96, 97, 103, E33.008, 257/E33.023, E33.033, E33.034; 438/34, 438/46
See application file for complete search history.

(56) References Cited

U.S. PATENT DOCUMENTS

| | | | |
|---|---|---|---|
| 5,684,309 A | 11/1997 | Mcintosh et al. | |
| 6,472,683 B1* | 10/2002 | Li | 257/25 |
| 6,838,693 B2* | 1/2005 | Kozaki | 257/14 |
| 6,906,352 B2* | 6/2005 | Edmond et al. | 257/94 |
| 6,958,497 B2* | 10/2005 | Emerson et al. | 257/94 |
| 6,995,389 B2* | 2/2006 | Kim et al. | 257/13 |
| 7,294,867 B2* | 11/2007 | Akita et al. | 257/103 |
| 7,329,894 B2* | 2/2008 | Kitatani et al. | 257/2 |
| 7,825,428 B2* | 11/2010 | Sakong et al. | 257/103 |
| 2002/0179923 A1* | 12/2002 | Morita et al. | 257/103 |
| 2005/0040414 A1* | 2/2005 | Hirayama et al. | 257/97 |
| 2005/0056824 A1* | 3/2005 | Bergmann et al. | 257/14 |
| 2005/0127391 A1* | 6/2005 | Yanamoto | 257/103 |
| 2009/0194775 A1 | 8/2009 | Chakraborty | |
| 2009/0200565 A1* | 8/2009 | Sakong et al. | 257/94 |

* cited by examiner

*Primary Examiner* — William F Kraig
(74) *Attorney, Agent, or Firm* — McDermott Will & Emery LLP

(57) ABSTRACT

There is provided a GaN-based semiconductor light emitting device including: a substrate; and an n-type GaN-based semiconductor layer, an active layer and a p-type GaN-based semiconductor layer sequentially deposited on the substrate, wherein the active layer includes: a first barrier layer including $Al_xIn_yGa_{1-x-y}N$, where $0<x<1$, $0<y<1$, and $0<x+y<1$; a second barrier layer having an energy band higher than an energy band of the first barrier layer and including one of $In_xGa_{1-x}N$, where $0<x<0.2$, and GaN; a well layer including $In_xGa_{1-x}N$, where $0<x<1$; a third barrier layer including one of $In_xGa_{1-x}N$, where $0<x<0.2$ and GaN; and a lattice mismatch relaxation layer including one of $Al_xIn_yGa_{1-x-y}N$, where $0<x<1$, $0<y<1$, and $0<x+y<1$, $Al_xGa_{1-x}N$, where $0<x<1$, and GaN, the lattice mismatch relaxation layer having a lattice constant greater than a lattice constant of the well layer and smaller than a lattice constant of the p-type GaN-based semiconductor layer.

6 Claims, 8 Drawing Sheets

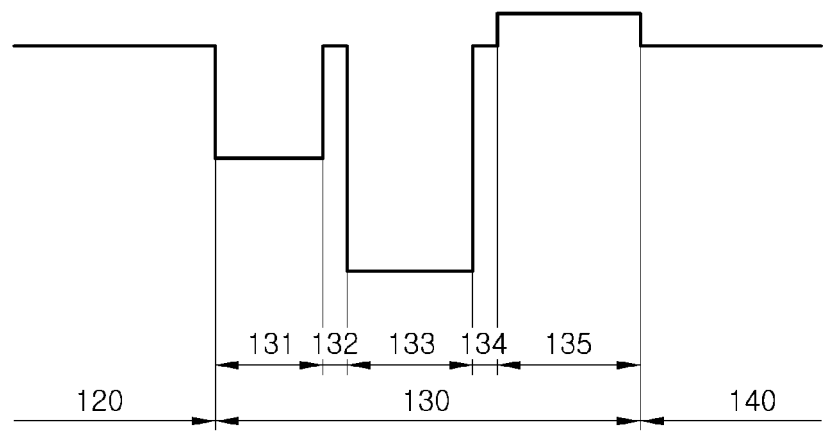
FIG. 3
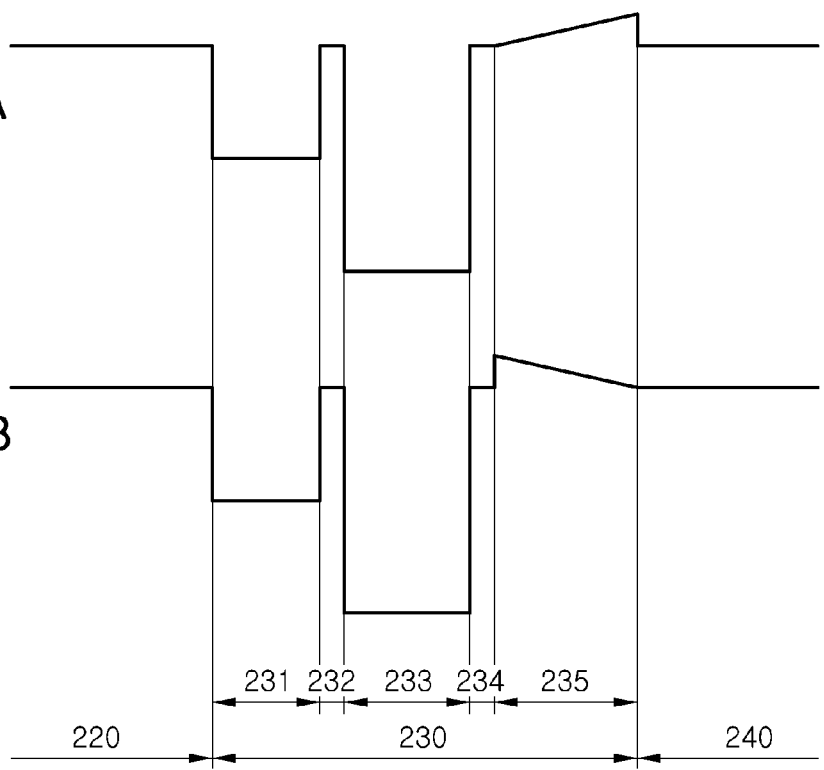
FIG. 4A
FIG. 4B

GAN-BASED SEMICONDUCTOR LIGHT EMITTING DEVICE

CROSS-REFERENCE TO RELATED APPLICATIONS

This application is a Continuation of U.S. application Ser. No. 12/251,872, filed on Oct. 15, 2008 now U.S. Pat. No. 7,825,428, claiming priority of Korean Patent Application No. 10-2008-0012244, filed on Feb. 11, 2008, the entire contents of each of which are hereby incorporated by reference.

BACKGROUND OF THE INVENTION

1. Field of the Invention

The present invention relates to a GaN-based semiconductor light emitting device, and more particularly, to a GaN-based semiconductor light emitting device, in which decline in internal quantum efficiency resulting from increase in supplied current is inhibited and strain occurring in an active layer due to lattice mismatch is reduced to thereby enhance emission efficiency.

2. Description of the Related Art

In a light emitting device, a material contained therein emits light. As an example, the light emitting device includes a light emitting diode (LED) which has semiconductors together, and converts and outputs an energy resulting from recombination of electrons and holes into light. This light emitting device is broadly used as a lighting device, display and light source and under accelerated development.

Particularly, a mobile phone key pad, side viewer and camera flash using a GaN-based LED which are under active development and utilization, have been commercially viable, thus boosting development of a general lighting apparatus using the LED. A backlight unit of a large-scale TV, a car head light and a general lighting apparatus and other applications evolved from a small portable product to a larger-scale, higher-output, higher-efficiency and more reliable product, thereby requiring a light source demonstrating characteristics necessary for the product.

In manufacturing a gallium nitride (GaN)-based light emitting device, a multi-layer nitride semiconductor thin film having at least two types of nitride thin films deposited therein may be deposited to ensure a desired emission spectrum and emission efficiency.

A material used for an active layer of a GaN-based semiconductor light emitting device adopts an InGan-based tertiary thin film structure. Light emitted from a band gap of an InGaN thin film purportedly has a wavelength covering visible rays, near ultraviolet rays or near infrared rays. To lengthen an emission wavelength in the InGaN film, an In compositional ratio can be increased in the film. However, with a higher compositional ratio of the InGaN thin film, the thin film is significantly degraded in characteristics and reduced in thickness enabling crystallinity to be maintained.

This phenomenon is known to result from phase separation of the tertiary InGaN material. With a higher compositional ratio of In, various characteristics are present in the InGaN thin film. Before phase separation caused by increase in In is completed, the two-dimensional thin film has some portions with different In compositional ratios, that is, suffers In localization. The phase separation can be aggravated by ambient temperature of the thin film or strain induced by lattice mismatch occurring in the multilayer thin film.

Moreover, to lengthen an emission wavelength in the InGaN thin film, the InGaN film may be increased in thickness in place of In compositional ratio. However, a greater thickness of the InGaN thin film deteriorates characteristics of the InGaN thin film. Accordingly, the InGaN thin film is typically formed with a small thickness, thereby experiencing decrease in density of state (DOS) in a quantum well (QW). As a result, a subsequent longer wavelength of the emission spectrum leads to rapid decline in internal quantum efficiency (IQE) caused by increase in supplied current.

Conventionally, the GaN-based semiconductor light emitting device is configured as a double hetero (DH) structure. That is, a layer is formed between one of n-type and p-type semiconductor layers and an InGaN well layer to have an energy band smaller than an energy band of the semiconductor layer and greater than an energy band of an InGaN layer, thereby serving as a charge supply layer to increase DOS. This technology may allow for increase in an amount of charges induced into a well layer but causes stress to be accumulated in the thin film to degrade crystallinity of the thin films sequentially deposited. Notably, in a GaN-based semiconductor light emitting device including a plurality of well layers, stress is continuously aggravated to undermine emission efficiency despite increase in DOS.

SUMMARY OF THE INVENTION

An aspect of the present invention provides a GaN-based semiconductor light emitting device in which decline in internal quantum efficiency resulting from increase in supplied current is inhibited and strain occurring in an active layer due to lattice mismatch is decreased to enhance emission efficiency.

An aspect of the present invention also provides a GaN-based semiconductor light emitting device including: a substrate; and an n-type GaN-based semiconductor layer, an active layer and a p-type GaN-based semiconductor layer sequentially deposited on the substrate, wherein the active layer includes: a first barrier layer formed on the n-type GaN-based semiconductor layer and including $Al_xIn_yGa_{1-x-y}N$, where $0<x<1$, $0<y<1$, and $0<x+y<1$; a second barrier layer formed on the first barrier layer and having an energy band higher than an energy band of the first barrier layer, the second barrier layer including one of $In_xGa_{1-x}N$, where $0<x<0.2$, and GaN; a well layer formed on the second barrier layer and including $In_xGa_{1-x}N$, where $0<x<1$; a third barrier layer formed on the well layer and including one of $In_xGa_{1-x}N$, where $0<x<0.2$ and GaN; and a lattice mismatch relaxation layer formed on the third barrier and including one of $Al_xIn_yGa_{1-x-y}N$, where $0<x<1$, $0<y<1$, and $0<x+y<1$, $Al_xGa_{1-x}N$, where $0<x<1$, and GaN, the lattice mismatch relaxation layer having a lattice constant greater than a lattice constant of the well layer and smaller than a lattice constant of the p-type GaN-based semiconductor layer.

The x may change within the lattice mismatch relaxation layer.

The x may be increased or decreased to an interface of the p-type GaN-based semiconductor layer from an interface between the lattice mismatch relaxation layer and the third barrier layer.

The GaN-based semiconductor light emitting device may further include at least one more active layer including the first and second barrier layers, the well layer, the third barrier layer and the lattice mismatch relaxation layer.

The $Al_xIn_yGa_{1-x-y}N$, where $0<x<1$, $0<y<1$, and $0<x+y<1$ may be doped or undoped.

The $Al_xIn_yGa_{1-x-y}N$, where $0<x<1$, $0<y<1$, and $0<x+y<1$ may be Si-doped.

The active layer may further include a fourth barrier layer formed between the third barrier layer and the lattice mismatch relaxation layer, the fourth barrier layer including $Al_xIn_yGa_{1-x-y}N$, where $0<x<1$, $0<y<1$, and $0<x+y<1$.

BRIEF DESCRIPTION OF THE DRAWINGS

The above and other aspects, features and other advantages of the present invention will be more clearly understood from the following detailed description taken in conjunction with the accompanying drawings, in which:

FIG. 3 is an energy band diagram of the GaN-based semiconductor light emitting device shown in FIG. 1;

FIGS. 4A and 4B are energy band diagrams of the GaN semiconductor light emitting device according to another exemplary embodiment of the invention;

DETAILED DESCRIPTION OF THE PREFERRED EMBODIMENT

Figure 1:
FIG. 1 is a cross-sectional view illustrating a GaN-based semiconductor light emitting device according to an exemplary embodiment of the invention.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

Figure 2:
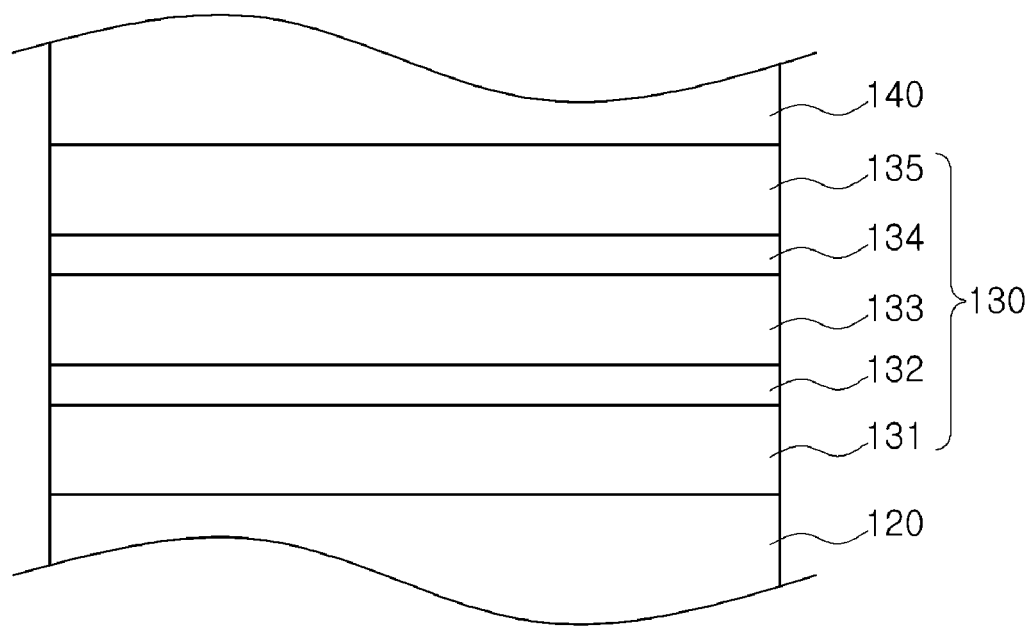
FIG. 2 is a magnified view illustrating an active layer of the GaN-based semiconductor light emitting device shown in FIG. 1.

FIG. 1 is a cross-sectional view illustrating a GaN-based semiconductor light emitting device according to an exemplary embodiment of the invention. FIG. 2 is a magnified view illustrating an active layer of the GaN-based semiconductor light emitting device shown in FIG. Referring to FIGS. 1 and 2, the GaN-based semiconductor light emitting device 100 of the present embodiment includes a substrate 110, and an n-type GaN-based semiconductor layer 120, an active layer 130, and a p-type GaN-based semiconductor layer 140 sequentially deposited on the substrate 110. The active layer 130 includes a first barrier layer 131, a second barrier layer 132, a well layer 133, a third barrier layer 134 and a lattice mismatch relaxation layer 135.

The first barrier layer 131 is formed on the n-type GaN-based semiconductor layer 120 and includes $Al_xIn_yGa_{1-x-y}N$, where $0<x<1$, $0<y<1$, and $0<x+y<1$. The second barrier layer 132 is formed on the first barrier layer 131 and has an energy band higher than an energy band of the first barrier layer 131. The second barrier layer 132 includes one of $In_xGa_{1-x}N$, where $0<x<0.2$, and GaN. The well layer 133 is formed on the second barrier layer 132 and includes $In_xGa_{1-x}N$, where $0<x<1$. The third barrier layer 134 is formed on the well layer 133 and includes one of $In_xGa_{1-x}N$, where $0<x<0.2$, and GaN. The lattice mismatch relaxation layer 135 is formed on the third barrier layer 134 and includes one of $Al_xIn_yGa_{1-x-y}N$, where $0<x<1$, $0<y<1$, and $0<x+y<1$, $Al_xGa_{1-x}N$, where $0<x<1$, and GaN. The lattice mismatch relaxation layer 135 has a lattice constant greater than a lattice constant of the well layer 133 and smaller than a lattice constant of the p-type GaN-based semiconductor layer 140.

The substrate 110 serves to grow or support the GaN-based semiconductor light emitting device 100. The substrate 110 may be a non-conductive growth substrate such as a sapphire substrate, or a conductive support substrate such as a metal or semiconductor substrate.

The n-type GaN-based semiconductor layer 120 and the p-type GaN-based semiconductor layer 140 may employ a GaN-based compound semiconductor, and the n-type GaN-based semiconductor layer 120 may contain one of Si, Ge, and Sn as a dopant. Meanwhile, the p-type GaN-based semiconductor layer 140 may contain one of Mg, Zn, and Be as a dopant.

Referring to FIG. 2, the active layer 130 activates light emission and includes the well layer 133 and the three barrier layers, i.e., first barrier layer 131, second barrier layer 132, and third barrier layer 134. Also, the active layer 130 includes the lattice mismatch relaxation layer 135 between the third barrier layer 134 and the lattice mismatch relaxation layer 135.

First, the well layer 133 where light is generated includes $In_xGa_{1-x}N$, where $0<x<1$. The well layer 133 has an energy band gap smaller than those of the n-type GaN-based semiconductor layer 120 and the p-type GaN-based semiconductor layer 140, respectively, thereby activating light emission. Here, the well layer 133, which is the active layer, may not be doped characteristically. The well layer can be adjusted in a mole ratio of composition material to control a wavelength of emitted light. Therefore, the GaN-based semiconductor light emitting device 100 can emit one of infrared rays, visible rays, and ultraviolet rays according to characteristics of the well layer 133.

The first barrier layer 131 is formed between the n-type GaN-based semiconductor layer 120 and the well layer 133. The first barrier layer 131 includes $Al_xIn_yGa_{1-x-y}N$, where $0<x<1$, $0<y<1$, and $0<x+y<1$. The first barrier layer 131 contains AlInGaN, i.e., quaternary GaN semiconductor. Thus, the first barrier layer 131 has an energy band gap smaller than an energy band gap of the n-type GaN-based semiconductor layer 120 and greater than an energy band gap of the well layer 133 containing InGaN, i.e., tertiary GaN semiconductor. FIG. 3 is an energy band diagram of the GaN-based semiconductor light emitting device shown in FIG. 1. Hereinafter, the present invention will be described with reference to FIGS. 1 to 3.

Referring to FIG. 3, the first barrier layer 131 has an energy band gap enabling electrons to be supplied to the well layer 133. Accordingly, since the well layer 133 is supplied with the electrons from the first barrier layer 131, density of state (DOS) in the entire system is increased. Moreover, the first barrier layer 131 contains AlInGaN, i.e., quaternary GaN semiconductor. This first barrier layer 131 is relatively superior in thin film characteristics and disposed between the n-type GaN-based semiconductor layer 120 made of GaN and the well layer 133 made of InGaN to reduce mismatch resulting from mismatch in the lattice constant.

The second barrier layer 132 and the third barrier layer 134 suppress the electrons to be migrated outward from the well layer 133. The second barrier layer 132 and the third barrier layer 134 may include one of $In_xGa_{1-x}N$, where $0<x<0.2$ and GaN, respectively. This configuration is designed to reduce lattice mismatch between the well layer 133 and the first barrier layer 131 and between the well layer 133 and the p-type GaN-based semiconductor layer 140.

The second barrier layer 132 and the third barrier layer 134 may have a thickness preventing the electrons from the well layer 133 from being migrated outward. Also, the second barrier layer 132 may have a thickness of e.g., 1.5 nm enabling the electrons to be tunneled from the first barrier layer 131 to the well layer 133 so that the electrons migrate from the first barrier layer 131 to the well layer 133.

The active layer 130 includes the plurality of layers such as the first barrier layer 131, the well layer 133, the second barrier layer 132 and the third barrier layer 134, whose lattice constants are accordingly not identical to one another. Therefore, in an entire area of the active layer 130, stress resulting from lattice mismatch between the n-type and p-type semiconductor layers 120 and 140 and the well layer 133 occurs and strain is accumulated due to the first barrier layer 131 deposited to increase the DOS. To overcome these problems, the lattice mismatch relaxation layer 135 is formed on the third barrier layer 134.

The lattice mismatch relaxation layer 135 serves to relax strain owing to lattice mismatch. The lattice mismatch relaxation layer 135 has a lattice constant greater than a lattice constant of the well layer 133 and smaller than a lattice constant of the p-type GaN-based semiconductor layer 140. The lattice mismatch relaxation layer 135 may include one of $Al_xIn_yGa_{1-x-y}N$, where $0<x<1$, $0<y<1$, and $0<x+y<1$, $Al_xGa_{1-x}N$, where $0<x<1$, and GaN as long as satisfying the lattice constant.

The lattice mismatch relaxation layer 135 is adjusted in compositional ratio according to composition of the well layer 133 and the p-type GaN-based semiconductor layer 140 to lower mismatch of the lattice constant. For example, the lattice mismatch relaxation layer 135 may have an In compositional ratio fixed and an Al compositional ratio varied to change the lattice constant. This ensures minimal strain and smooth migration of the electrons.

The lattice mismatch relaxation layer 135 may include quaternary $Al_xIn_yGa_{1-x-y}N$, where $0<x<1$, $0<y<1$, and $0<x+y<1$. The quaternary AlInGaN suppresses decline in crystallinity of the lattice mismatch relaxation layer 135. This accordingly allows the lattice constant mismatch with the well layer 133 to be relaxed in a broader wavelength.

The $Al_xIn_yGa_{1-x-y}N$, where $0<x<1$, $0<y<1$, and $0<x+y<1$ of the lattice mismatch relaxation layer 135 may be doped or undoped. The $Al_xIn_yGa_{1-x-y}N$, where $0<x<1$, $0<y<1$, and $0<x+y<1$ may be Si-doped.

FIG. 1 does not illustrate electrodes for applying a voltage to the GaN-based semiconductor light emitting device 100 but the GaN-based semiconductor light emitting device 100 may include an n-electrode and a p-electrode. The electrodes may be formed of a metal. For example, the n-electrode may be made of Ti and the p-electrode may be made of Pd or Au.

FIGS. 4A and 4B are energy band diagrams of the GaN semiconductor light emitting device according to another exemplary embodiment of the invention. FIG. 4 illustrates various configurations of the active layer 230 according to another exemplary embodiment of the invention.

FIGS. 4A and 4B show energy bands of an n-type GaN-based semiconductor layer 220, an active layer 230 and a p-type GaN-based semiconductor layer 240, respectively. The active layer 230 is illustrated to include a first barrier layer 231, a second barrier layer 232, a well layer 233, a third barrier layer 234 and a lattice mismatch relaxation layer 235. Here, the n-type GaN-based semiconductor layer 220, the active layer 230 and the p-type GaN-based semiconductor layer 240 are identical to those described with reference to FIGS. 1 to 3 except the lattice mismatch relaxation layer 235, and thus will not be described in further detail.

In a case where the lattice mismatch relaxation layer 235 includes one of $Al_xIn_yGa_{1-x-y}N$, where $0<x<1$, $0<y<1$, and $0<x+y<1$ and $Al_xGa_{1-x}N$, where $0<x<1$, the x does not have a fixed value but can be varied within the lattice mismatch relaxation layer 235. The x may be increased or decreased from an interface between the lattice mismatch relaxation layer 235 and the third barrier layer 234 to an interface of the p-type GaN-based semiconductor layer 240.

That is, in the lattice mismatch relaxation layer 235, the x, which is a compositional ratio of Al, can be varied in the lattice mismatch relaxation layer. Here, the x may be adjusted gradually upward or downward. Referring to FIG. 4A, the lattice mismatch relaxation layer 235 has an energy band starting at a level identical to an energy band of the third barrier layer 234 and lowered toward the p-type GaN-based semiconductor layer 240. Meanwhile, referring to FIG. 4B, the lattice mismatch relaxation layer 235 has an energy band lowered than an initial value toward the p-type GaN-based semiconductor layer 240 with respect to the third barrier layer 234. In this fashion, by adjusting a compositional ratio of a predetermined element of the lattice mismatch relaxation layer 235, the active layer 230 can be decreased in strain resulting from lattice mismatch more efficiently.

Figure 5:
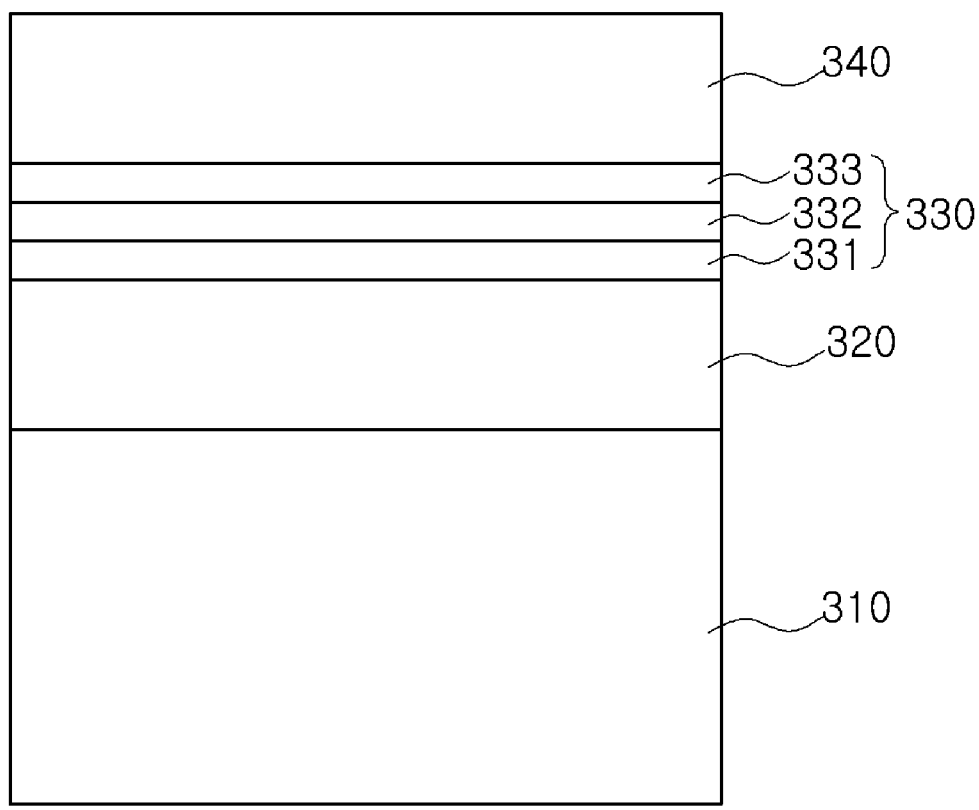
FIG. 5 is a cross-sectional view illustrating a GaN-based semiconductor light emitting device according to another exemplary embodiment of the invention.
Figure 6:
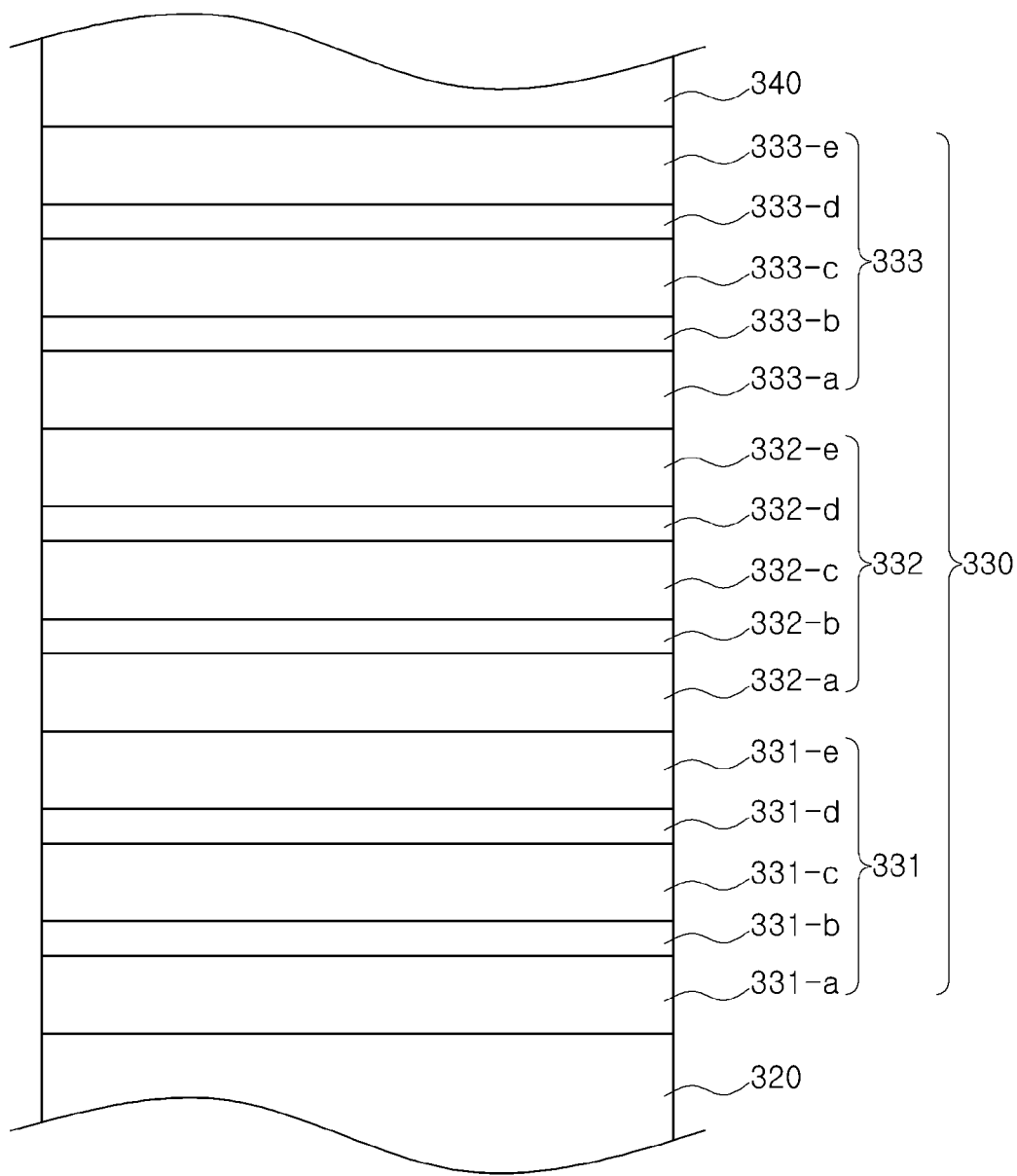
FIG. 6 is a magnified view illustrating an active layer of the GaN-based semiconductor light emitting device shown in FIG. 5.

FIG. 5 is a cross-sectional view illustrating a GaN-based semiconductor light emitting device according to another exemplary embodiment of the invention. FIG. 6 is a magnified view illustrating an active layer of the GaN-based semiconductor light emitting device shown in FIG. 5. According to the present embodiment, the GaN-based semiconductor light emitting device 300 includes at least one active layer having a first barrier layer, a second barrier layer, a well layer, a third barrier layer, and a lattice mismatch relaxation layer. In the present embodiment, the GaN-based semiconductor light emitting device 300 is illustrated to include three active layers. The first barrier layer, the second barrier layer, the well layer, the third barrier layer, and the lattice mismatch relaxation layer of the active layer are identical to those of FIGS. 1 to 4 and thus will not be described in further detail.

The GaN-based semiconductor light emitting device 300 includes three active layers 331, 332, and 333 having first barrier layers 331-a, 332-a, and 333-a, second barrier layers 331-b, 332-b, and 333-b, well layers 331-c, 332-c, and 333-c, third barrier layers 331-d, 332-d, and 333-d and lattice mismatch relaxation layers 331-e, 332-e, and 333-e, respectively.

Figure 7:
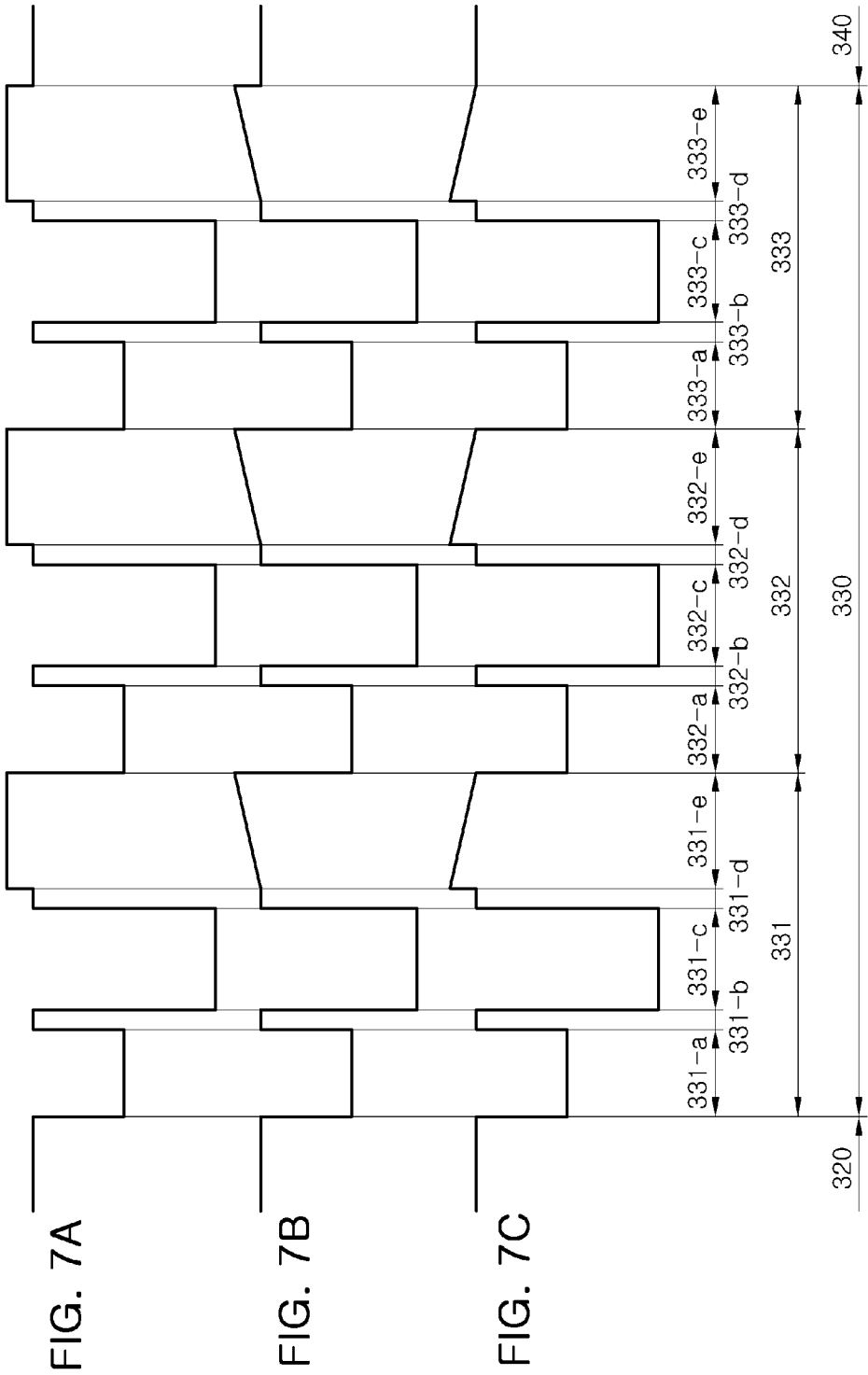
FIGS. 7A to 7C are energy band diagrams of the GaN-based semiconductor light emitting device shown in FIG. 5 and GaN-based semiconductor light emitting device according to another exemplary embodiment of the invention.

FIG. 7A is an energy band diagram of the GaN-based semiconductor light emitting device shown in FIG. 5 and FIGS. 7B and 7C are energy band diagrams of a GaN-based semiconductor light emitting device according to another exemplary embodiment of the invention.

Three active layers 331, 332, and 333 include first barrier layers 331-a, 332-a, and 333-a and lattice mismatch relaxation layers 331-e, 332-e, and 333-e, respectively. Accordingly, the first barrier layers serve to increase DOS, thus reducing strain and the lattice mismatch relation layers each disposed between the active layers more effectively suppresses accumulation of strain due to lattice mismatch caused by the plurality of active layers deposited.

Referring to FIG. 7A, the lattice mismatch relaxation layers 331-e, 332-e, and 333-e each have an Al compositional ratio identical to one another. Also, referring to FIGS. 7B and 7C, the lattice mismatch relaxation layers 331-e, 332-e, and 333-e each have an Al compositional ratio increasing or decreasing from an interface between the lattice mismatch relaxation layers and the third barrier layers 331-d, 332-d, and 333-d, respectively. The lattice mismatch relaxation layers 331-e, 332-e, and 333-e each can be varied in compositional ratio to more effectively suppress and reduce strain resulting from lattice mismatch.

FIGS. 8A to 8D are energy band diagrams of a GaN-based semiconductor light emitting device according to still another exemplary embodiment of the invention. The GaN-based semiconductor light emitting device 400 of the present embodiment includes a substrate (not illustrated), an n-type GaN-based semiconductor layer 420, an active layer 430 and a p-type GaN-based semiconductor layer 440. The active layer 430 is formed of a plurality of layers 431, 432, and 433. The active layers 431, 432, and 433 include first barrier layers 431-a, 432-a, and 433-a, second barrier layers 431-b, 432-b, and 433-b, well layers 431-c, 432-c, and 433-c, third barrier layers 434-d, 432-d, and 433-d, and lattice mismatch relaxation layers 431-f, 432-f, and 433-f, respectively. The active layers each may further include a corresponding one of fourth barrier layers 431-e, 432-e, and 433-e between the third barrier layers 434-d, 432-d, 433-d and the lattice mismatch relaxation layers 431-f, 432-f, and 433-f, respectively and includes $Al_xIn_yGa_{1-x-y}N$, where $0<x<1$, $0<y<1$, and $0<x+y<1$.

In the present embodiment, each of the active layers 431, 432 and 433 further includes a corresponding one of the fourth barrier layers 431-e, 432-e, and 433-e interposed between the third barrier layer 434-d, 432-d, and 433-d the lattice mismatch relaxation layer 431-f, 432-f, and 433-f, respectively. The respective fourth barrier layers 431-e, 432-e, and 433-e of the active layers are adjusted in compositional ratio to function similarly to the first barrier layers 431-a, 432-a, and 433-a, respectively. This allows charges to be supplied to the well layers 431-c, 432-c, and 433-c to increase DOC and further reduce strain resulting from lattice mismatch.

Figure 8:
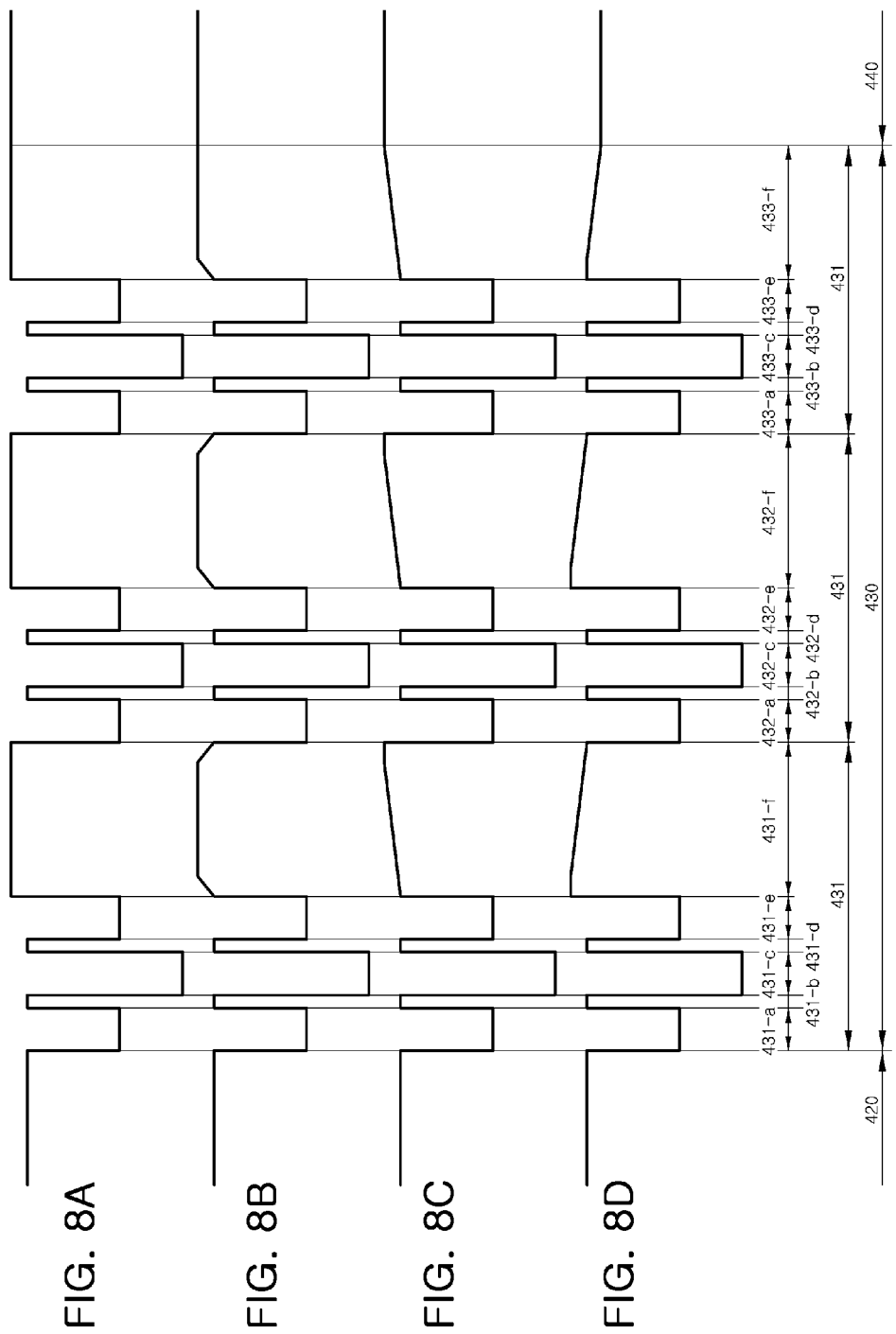
FIGS. 8A to 8D are energy band diagrams of GaN-based semiconductor light emitting device according to still another exemplary embodiment of the invention.

The lattice mismatch relaxation layers 431-f, 432-f, and 433-f each may have an identical compositional ratio in each corresponding one of the active layers (see FIG. 8A). Alternatively, to relax lattice mismatch more effectively, as shown in FIG. 8B, the compositional ratio of the lattice mismatch relaxation layer may be increased or decreased in a predetermined area from an interface between the lattice mismatch relaxation layer and the fourth barrier layer 431-e, 432-e, and 433-e and from an interface between the lattice mismatch relaxation layer and the next active layer and can be maintained constant in the remaining area. Moreover, referring to FIGS. 8C and 8D, the lattice mismatch relaxation layer 431-f, 432-f, and 433-f may have a compositional ratio increasing or decreasing from an interface between the lattice mismatch relaxation layer and a corresponding one of the fourth barrier layers 431-e, 432-e, and 433-e to thereby suppress and reduce strain induced by lattice mismatch.

Figure 9:
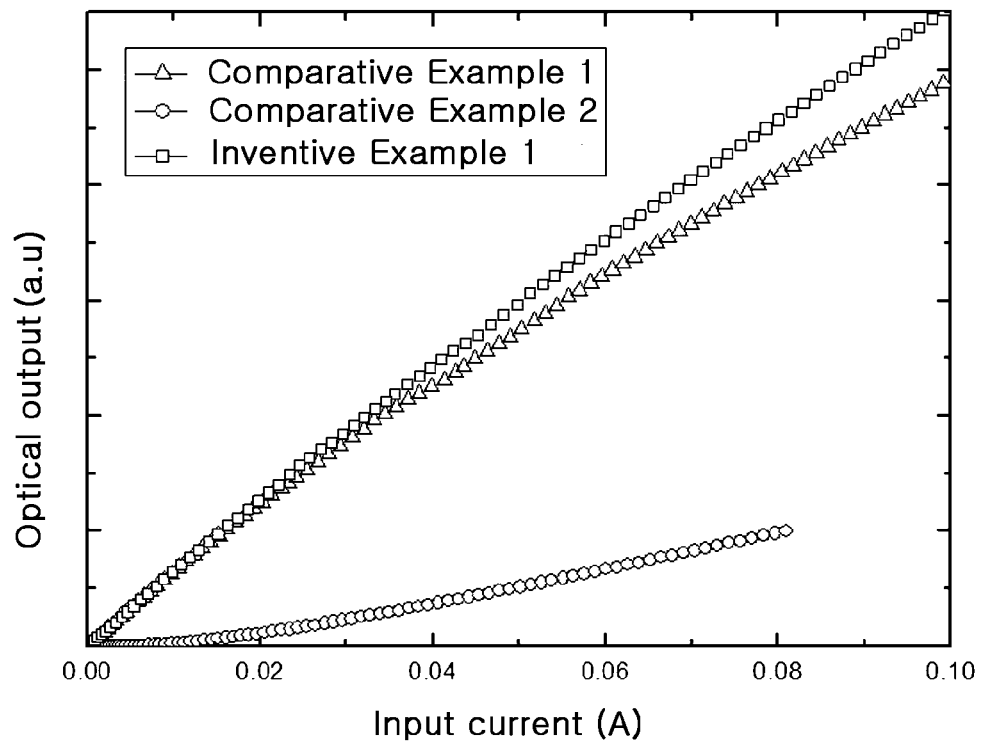
FIG. 9 is a graph illustrating optical output with respect to input current of GaN-based semiconductor light emitting devices according to Comparative Examples and Inventive Example, respectively.
Figure 10:
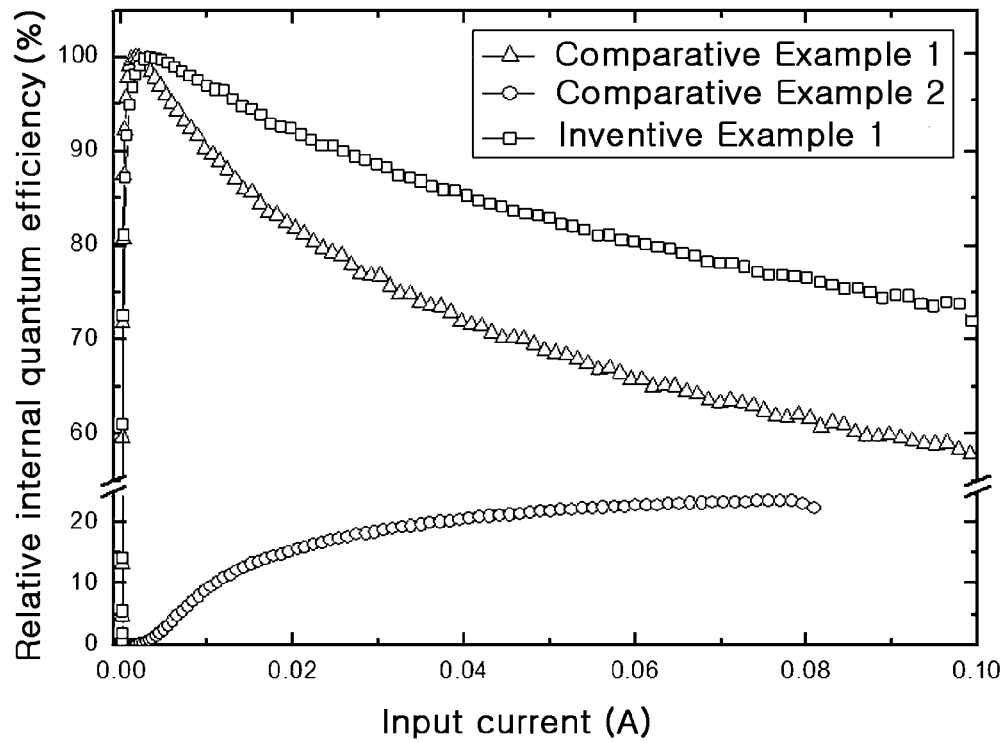
FIG. 10 is a graph illustrating relative internal quantum efficiency with respect to input current of GaN-based semiconductor light emitting devices according to Comparative Examples and Inventive Example, respectively.
Figure 11:
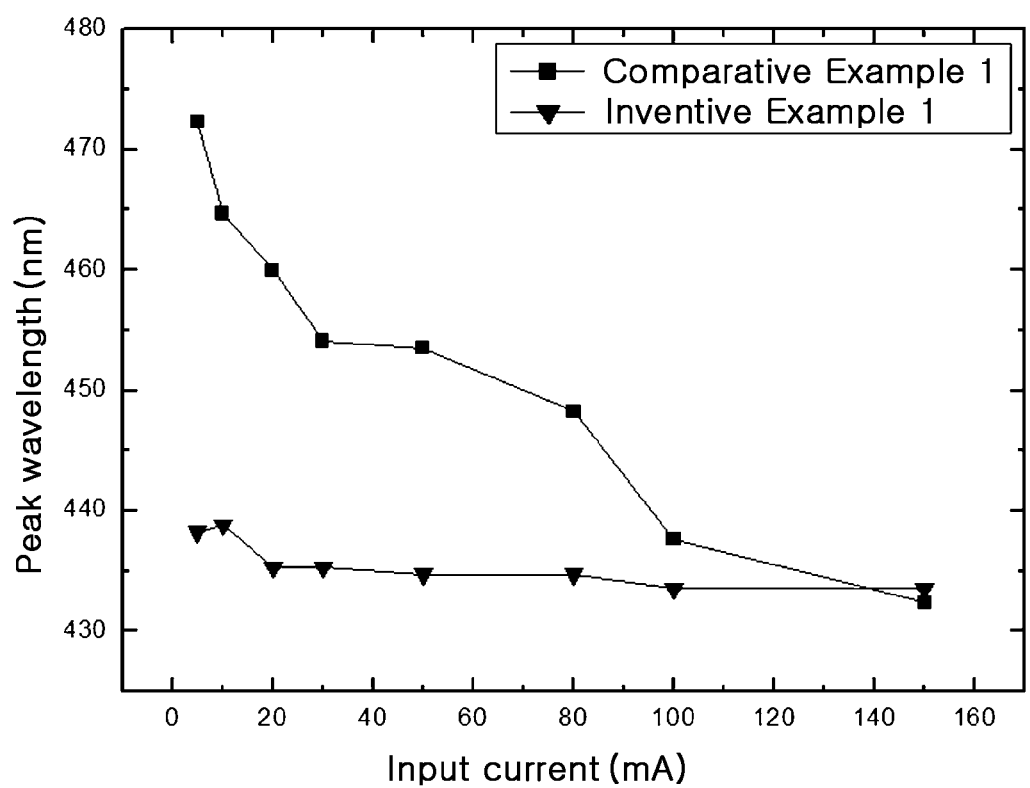
FIG. 11 is a graph illustrating peak wavelength with respect to input current of GaN-based semiconductor light emitting devices according to according to Comparative Example and Inventive Example, respectively.

FIG. 9 is a graph illustrating optical output with respect to input current of GaN-based semiconductor light emitting devices according to Comparative Examples and Inventive Example, respectively. FIG. 10 is a graph illustrating relative quantum efficiency with respect to input current of GaN-based semiconductor light emitting devices according to Comparative Examples and Inventive Example, respectively. FIG. 11 is a graph illustrating peak wavelength with respect to input current of GaN-based semiconductor light emitting devices according to Comparative Example and Inventive Example, respectively. Measurement was conducted on Comparative Example 1, Comparative Example 2 and an Inventive Example 1. Here, Comparative Example 1 is a GaN-based semiconductor light emitting device including an active layer having a plurality of GaN barrier layers and a plurality of InGaN well layers. Comparative Example 2 is a GaN-based semiconductor light emitting device including an active layer having a plurality of barrier layers formed of a quaternary AlInGaN and a plurality of barrier layers formed of GaN or InGaN for separating the quaternary AlInGaN-containing barrier layers from InGaN well layers. Inventive Example 1 is a GaN-based semiconductor light emitting device shown in FIG. 5.

FIGS. 9 and 10 illustrate comparison results of EL characteristics between Inventive Example 1, which is a GaN-based light emitting device and Comparative Examples 1 and 2, which are conventional GaN-based semiconductor light emitting devices. Referring to FIGS. 9 and 10, Inventive Example 1 exhibits better internal quantum efficiency than Comparative Example 1 due to increase in supplied current. Comparative Example 2 demonstrates much lower photoelectric properties in a low power.

FIG. 11 shows observation results of peak change of emission spectrum with respect to the supplied current of Comparative Example 1 and Inventive Example 1. Here, a well layer has a thickness of 4 nm. In a case where the well layer has a relatively great thickness, Inventive Example 1 shows much less peak shift than Comparative Example 1, thereby exhibiting much superior characteristics.

As set forth above, in a GaN-based semiconductor light emitting device according to exemplary embodiments of the invention, an active layer includes a quaternary AlInGaN layer to increase phase density of electrons present in the system, thereby ensuring a greater amount of charges to be induced into a well layer. This also reduces strain caused in the active layer due to lattice mismatch, thereby producing a reliable GaN-based light emitting device.

This as a result produces a GaN-based semiconductor light emitting device with superior emission efficiency, in which strain-induced In localization is restrained from being aggravated and emission efficiency is inhibited from being degraded due to phase separation, and a peak wavelength of a desired emission peak wavelength is not considerably changed according to supplied current.

While the present invention has been shown and described in connection with the exemplary embodiments, it will be apparent to those skilled in the art that modifications and variations can be made without departing from the spirit and scope of the invention as defined by the appended claims.

What is claimed is:
1. A semiconductor light emitting device comprising:
   a substrate; and
   a light emitting structure having a first semiconductor layer, an active layer and a second semiconductor layer sequentially deposited on the substrate, wherein the active layer includes:
a first barrier layer formed on the first semiconductor layer and having an energy band higher than an energy band of a well layer;
a second barrier layer formed on the first barrier layer and having an energy band higher than an energy band of the first barrier layer;
the well layer formed on the second barrier layer and having an energy band lower than an energy band of the first and second semiconductor layers;
a third barrier layer formed on the well layer and having an energy band higher than an energy band of the well layer; and
a lattice mismatch relaxation layer formed on the third barrier, the lattice mismatch relaxation layer having a lattice constant greater than a lattice constant of the well layer and smaller than a lattice constant of the second semiconductor layer.

2. The semiconductor light emitting device of claim 1, wherein a composition changes within the lattice mismatch relaxation layer.

3. The semiconductor light emitting device of claim 1, further comprising at least one more active layer.

4. The semiconductor light emitting device of claim 1, wherein the lattice mismatch relaxation layer is doped or undoped.

5. The semiconductor light emitting device of claim 4, wherein a lattice mismatch relaxation layer is Si-doped.

6. The semiconductor light emitting device of claim 1, wherein the active layer further comprises a fourth barrier layer formed between the third barrier layer and the lattice mismatch relaxation layer, the fourth barrier layer comprising $Al_xIn_yGa_{1-x-y}N$, where $0<x<1$, $0<y<1$, and $0<x+y<1$.

* * * * *

UNITED STATES PATENT AND TRADEMARK OFFICE
CERTIFICATE OF CORRECTION

| | | |
|---|---|---|
| PATENT NO. | : 8,378,381 B2 | Page 1 of 1 |
| APPLICATION NO. | : 12/890361 | |
| DATED | : February 19, 2013 | |
| INVENTOR(S) | : Sakong et al. | |

It is certified that error appears in the above-identified patent and that said Letters Patent is hereby corrected as shown below:

On the Title Page of the Patent, in Item "(73) Assignee: Sumitomo Electric Industries Ltd., Osaka (JP)," the Assignee should be SAMSUNG ELECTRONICS CO., LTD., Suwon-si, Republic of Korea.

Signed and Sealed this
Twenty-ninth Day of October, 2013

Teresa Stanek Rea
*Deputy Director of the United States Patent and Trademark Office*